(12) United States Patent
Yamada

(10) Patent No.: US 10,775,443 B2
(45) Date of Patent: Sep. 15, 2020

(54) SECONDARY BATTERY DEGRADATION DETERMINATION DEVICE

(71) Applicant: NTN CORPORATION, Osaka (JP)

(72) Inventor: Hiroyuki Yamada, Iwata (JP)

(73) Assignee: NTN CORPORATION, Osaka (JP)

( * ) Notice: Subject to any disclaimer, the term of this patent is extended or adjusted under 35 U.S.C. 154(b) by 111 days.

(21) Appl. No.: 16/206,179

(22) Filed: Nov. 30, 2018

(65) Prior Publication Data

US 2019/0094311 A1 Mar. 28, 2019

Related U.S. Application Data

(63) Continuation of application No. PCT/JP2017/020353, filed on May 31, 2017.

(30) Foreign Application Priority Data

Jun. 2, 2016 (JP) .................................. 2016-110656

(51) Int. Cl.
*H01M 10/48* (2006.01)
*G01R 31/392* (2019.01)
(Continued)

(52) U.S. Cl.
CPC .......... *G01R 31/392* (2019.01); *G01R 31/36* (2013.01); *G01R 31/3646* (2019.01);
(Continued)

(58) Field of Classification Search
None
See application file for complete search history.

(56) References Cited

U.S. PATENT DOCUMENTS 7,362,074 B2  4/2008  Iwane et al.
8,652,670 B2  2/2014  Uchida
(Continued)

FOREIGN PATENT DOCUMENTS

CN  105378499 A   3/2016
JP  8-339829      12/1996
(Continued)

OTHER PUBLICATIONS

English translation by WIPO of the International Preliminary Report on Patentability dated Dec. 13, 2018 in corresponding International Patent Application No. PCT/JP2017/020353, 6 pages.
(Continued)

*Primary Examiner* — Wyatt P McConnell

(57) ABSTRACT

The secondary battery degradation determination device includes: a plurality of voltage sensors connected to respective batteries; a measurement current application device configured to apply a measurement current including an AC component to each battery group; and a controller. A sensor wireless communicator configured to wirelessly transmit a measurement value of a voltage of the AC component is provided to each voltage sensor. One current sensor is provided for a parallel-connection assembly of the battery groups. The controller is configured to receive the measurement value transmitted by the sensor wireless communicator, calculate an internal resistance of each battery by using the measurement value and a detection value of the current sensor, and determine degradation of the battery on the basis of the internal resistance.

7 Claims, 9 Drawing Sheets

(51) Int. Cl.
*G01R 31/36* (2020.01)
*H02J 7/00* (2006.01)
*G01R 31/387* (2019.01)

(52) U.S. Cl.
CPC .......... *G01R 31/387* (2019.01); *H01M 10/48* (2013.01); *H01M 10/482* (2013.01); *H02J 7/00* (2013.01)

(56) References Cited

U.S. PATENT DOCUMENTS

| | | | |
|---|---|---|---|
| 8,928,174 B2 | 1/2015 | Muto et al. | |
| 10,393,814 B2 | 8/2019 | Takashima et al. | |
| 2005/0017686 A1* | 1/2005 | Sakakibara | G01R 31/392 320/132 |
| 2005/0017687 A1* | 1/2005 | Nagaoka | H02J 7/0047 320/132 |
| 2006/0186890 A1 | 8/2006 | Iwane et al. | |
| 2012/0013180 A1 | 1/2012 | Muto et al. | |
| 2013/0149578 A1 | 6/2013 | Uchida | |
| 2016/0131716 A1 | 5/2016 | Takashima et al. | |

FOREIGN PATENT DOCUMENTS

| | | |
|---|---|---|
| JP | 10-170615 | 6/1998 |
| JP | 2003-111289 | 4/2003 |
| JP | 2003-121512 A | 4/2003 |
| JP | 2005-100969 | 4/2005 |
| JP | 2010-164441 | 7/2010 |
| JP | 2010-239709 | 10/2010 |
| JP | 2013-140055 | 7/2013 |
| JP | 2014-236625 | 12/2014 |
| JP | 2017-150925 | 8/2017 |
| WO | WO 2005/078673 A1 | 8/2005 |
| WO | WO 2012/050126 A1 | 4/2012 |

OTHER PUBLICATIONS

"AC 4-terminal-method battery tester", Internal Resistance Measuring Instrument IW7807-BP, Rev. 1.7.1, Feb. 16, 2015, Tokyo Devices. http://tokyodevices.jp/system/attachments/files/000/000/298/original/IW7807-BP-F_MANUAL.pdf†.

International Search Report dated Aug. 15, 2017 in corresponding International Application No. PCT/JP2017/020353.

U.S. Appl. No. 16/103,395, filed Aug. 14, 2018, Hiroyuki Yamada, NTN Corporation.

U.S. Appl. No. 16/134,267, filed Sep. 18, 2018, Hiroyuki Yamada, NTN Corporation.

U.S. Appl. No. 16/138,176, filed Sep. 21, 2018, Hiroyuki Yamada, NTN Corporation.

U.S. Appl. No. 16/144,576, filed Sep. 27, 2018, Hiroyuki Yamada, NTN Corporation.

Chinese Office Action dated Apr. 29, 2020, in corresponding Chinese Patent Application No. 201780033360.3 (13 pages).

* cited by examiner

SECONDARY BATTERY DEGRADATION DETERMINATION DEVICE

CROSS REFERENCE TO THE RELATED APPLICATION

This application is a continuation application, under 35 U.S.C. § 111(a), of international application No. PCT/JP2017/020353, filed May 31, 2017, which is based on and claims Convention priority to Japanese patent application No. 2016-110656, filed Jun. 2, 2016, the entire disclosure of which is herein incorporated by reference as a part of this application.

BACKGROUND OF THE INVENTION

Field of the Invention

The present invention relates to a secondary battery degradation determination device that determines degradation of secondary batteries used in an emergency power supply or the like in a data center, a mobile phone base station, or other various types of power supply devices for which stable supply of power is required.

Description of Related Art

Stable supply of power is important to data centers, mobile phone base stations, etc. A commercial AC power supply is used in a normal state, and an emergency power supply in which secondary batteries are used is provided as an uninterruptible power supply for a case where the commercial AC power supply is stopped. Modes for charging the emergency power supply include: a trickle charge mode in which charging is performed with a minute current in a normal state using a charging circuit; and a float charge mode in which a load and a secondary battery are connected in parallel with respect to a rectifier, and charging is performed while the load is being operated by applying a constant current. Generally, the trickle charge mode is adopted for many emergency power supplies.

For the emergency power supply, a voltage and a current that allow a load, which is driven by a commercial power supply, to be driven are required, and one secondary battery has a low voltage and also has a small capacity. Thus, the emergency power supply is configured by connecting, in parallel, a plurality of battery groups each including a plurality of batteries connected in series. Each of the batteries is a lead storage battery or a lithium ion battery.

In such an emergency power supply, the voltage of each battery is decreased due to degradation of the battery. Thus, for ensuring reliability, desirably, battery degradation determination is performed and a battery that has been degraded is replaced. However, a device capable of accurately determining degradation of multiple batteries in a large-scale emergency power supply in a data center, a mobile phone base station, or the like has not been proposed yet.

Examples of proposals of conventional battery degradation determination include next proposals: a vehicle-mounted-battery checker collectively measures the entire battery (e.g., Patent Document 1); a proposal in which a pulse-shaped voltage is applied to a battery, and the internal impedance of the entire battery is calculated from an input voltage and the response voltage (e.g., Patent Document 2); and a method in which the internal resistances of individual cells connected in series in a battery are measured and degradation determination is performed (e.g., Patent Document 3), etc. . . . . . In addition, a battery tester employing an AC four-terminal method has been commercialized as a handy checker for measuring a very small resistance value such as an internal resistance of a battery (e.g., Non-Patent Document 1).

In Patent Documents 1 and 2, wireless transmission of data has also been proposed, and reduction of handling a cable or manual work and data management by a computer have also been proposed.

RELATED DOCUMENT

Patent Document

[Patent Document 1] JP Laid-open Patent Publication No. H10-170615
[Patent Document 2] JP Laid-open Patent Publication No. 2005-100969
[Patent Document 3] JP Laid-open Patent Publication No. 2010-164441

Non-Patent Document

[Non-Patent Document 1] AC Four-Terminal Method Battery Tester Internal Resistance Measuring Device IW7807-BP (Rev.1.7.1, Feb. 16, 2015, Tokyo Devices) (https://tokyodevices.jp/system/attachments/files/000/000/298/original/IW7807-BP-F_MANUAL.pdf)

With the conventional handy checker (Non-Patent Document 1), the number of measurement locations is excessive in an emergency power supply in which dozens or hundreds of batteries are connected. Thus, use of the conventional handy checker is not feasible. In each of the technologies of Patent Documents 1 and 2, the entirety of a power supply including batteries is measured, and the individual batteries, that is, individual cells, are not measured. Thus, the accuracy of degradation determination is low, and individual batteries that have been degraded cannot be identified.

By measuring the internal resistance of each cell connected in series, the technology of Patent Document 3 leads to a technology to improve the accuracy of degradation determination and identify individual batteries that have been degraded. However, the reference potential (ground level) of each voltage sensor is negative terminal potential of each cell. Thus, in this state, in a battery group in which dozens to hundreds of batteries are directly connected to each other, the reference potentials of the respective batteries are all different from each other. How to deal with the differences in reference potential is not disclosed in this document. Generally, in order to acquire the potential of each cell, it is necessary to detect a potential difference through differential operation or to use an isolation transformer, so that the configuration becomes complicated and expensive.

As a device that solves these problems, a secondary battery degradation determination device shown in FIG. 10 has been previously proposed (JP Laid-open Patent Publication No. 2017-150925). Specifically, this device is a secondary battery degradation determination device that determines degradation of each battery 2 in a power supply 1 in which a plurality of battery groups 3 each including a plurality of batteries 2 that are secondary batteries and are connected in series are connected in parallel. The secondary battery degradation determination device includes: a plurality of voltage sensors 7 individually connected to the respective batteries 2; a measurement current application device 9 that applies a measurement current including an AC component to each battery group 3; a sensor wireless communicator 10 that is provided to each voltage sensor 7 and wirelessly transmits a measurement value of the voltage of the AC component measured; and a controller 11 that receives the measurement value transmitted by each sensor wireless communicator 10, calculates the internal resistance of each battery 2 by using the received measurement value, and determines degradation of the battery 2 on the basis of the internal resistance. In FIG. 10, portions or sections corresponding to those in embodiments to be described later are designated by the same reference numerals.

According to this configuration, the measurement value of each voltage sensor 7 is wirelessly transmitted to the controller 11. Since wireless transmission is performed as described above, even when the multiple batteries 2 connected in series and forming the battery groups 3 are present, for example, even when the number of such batteries is dozens to hundreds, the reference potential (ground level) of each voltage sensor 7 can be common, and there is no need to care about the reference potential. Thus, differential operation and an isolation transformer are not necessary. In addition, since the measurement value of each of the plurality of voltage sensors is wirelessly transmitted, complicated wiring is not necessary. Accordingly, the configuration can be simple and inexpensive. In addition, degradation of the entire power supply 1 to be subjected to degradation determination is not determined but degradation of each battery 2 is determined. Thus, degradation of each battery 2 can be accurately determined.

However, a current sensor 8 is provided to each battery group 3 in which the batteries 2 are connected in series, so that the number of current sensors 8 is large and the configuration is complicated and expensive. There is room for allowing the configuration to be simpler and more inexpensive by reducing the number of current sensors 8.

SUMMARY OF THE INVENTION

An object of the present invention is to provide a secondary battery degradation determination device that can be produced more simply at lower cost and that can accurately determine degradation of each battery in a power supply in which a plurality of battery groups each including a plurality of batteries that are secondary batteries and are connected in series are connected in parallel.

Hereinafter, in order to facilitate understanding of the present invention, the present invention will be described with reference to the reference numerals in embodiments for the sake of convenience.

A secondary battery degradation determination device of the present invention is a secondary battery degradation determination device that determines degradation of each battery 2 in a power supply 1 in which a plurality of battery groups 3 each including a plurality of batteries 2 that are secondary batteries and are connected in series are connected in parallel, the secondary battery degradation determination device including:

a plurality of voltage sensors 7 individually connected to the respective batteries 2;

a current sensor 8 provided for a parallel-connection assembly 3B including a plurality of the battery groups 3 connected in parallel, the current sensor 8 being configured to detect a current flowing through an entirety of the parallel-connection assembly 3B;

a measurement current application device 9 configured to apply a measurement current including an AC component to each battery group 3;

a sensor wireless communicator 10 provided to each voltage sensor 7 and configured to wirelessly transmit a measurement value of a voltage of the AC component measured; and a controller 11 configured to receive the measurement value transmitted by each sensor wireless communicator 10, calculate an internal resistance of each battery 2 by using the received measurement value and a measurement value of the current sensor 8, and determine degradation of the battery 2 on the basis of the internal resistance.

The AC component as used herein is a component of which the magnitude of a voltage or current repeatedly changes, but may have a voltage or current of which the direction is constantly fixed, for example, a ripple current or a pulse current. The "battery" may be a battery including a plurality of cells connected in series, or may be a single cell. In addition, the "controller" is not limited to a single component, but may be divided into, for example, a main controller 11A including a receiver for receiving the measurement value, and an information processing device such as a data server 13 connected to the main controller 11A via a communication part 12 such as a LAN and configured to calculate the internal resistance of each battery 2.

According to this configuration, the measurement value of each voltage sensor 7 is wirelessly transmitted to the controller 11. Even when the multiple batteries 2 connected in series and forming the battery groups 3 are present, for example, even when the number of such batteries is dozens to hundreds, since wireless transmission is performed, the reference potential (ground level) of each voltage sensor 7 can be common, and there is no need to care about the reference potential. Thus, differential operation and an isolation transformer are not necessary. In addition, since the measurement value of each of the plurality of voltage sensors is wirelessly transmitted, complicated wiring is not necessary. Accordingly, the configuration can be simple and inexpensive.

Degradation of the entire power supply 1 to be subjected to degradation determination is not determined, but degradation of each battery 2 is determined. In addition, for the determination, the measurement current including the AC component is applied, the internal resistance of each battery 2 is calculated by using the transmitted measurement value of the voltage and the measurement value of the current sensor 8, and degradation of the battery 2 is determined on the basis of the internal resistance. Thus, degradation determination can be accurately performed. The internal resistance of the battery 2 is closely related to the capacity of the battery 2, that is, the degree of degradation of the battery 2, and thus degradation of the battery 2 can be accurately determined when the internal resistance is known.

Regarding the calculation of the internal resistance, merely with measurement of a voltage, the calculation of the internal resistance is possible, for example, by assuming a current as a constant value. However, the internal resistance can be more accurately calculated when a current actually flowing through the battery 2 is measured and both the voltage and the current are acquired. Even when, for the measurement of the current, one current sensor 8 is provided to detect the current flowing through the entirety of the parallel-connection assembly 3B of the battery groups 3, almost no practical difference in obtaining the internal resistance of each battery 2 can be recognized as compared with the case where a current sensor 8 is provided for each battery group 3. Thus, by providing one current sensor 8 for each parallel-connection assembly 3B of the battery groups 3, configuration simplification and cost reduction due to reduction of the number of current sensors 8 used can be achieved while the accuracy of degradation detection is maintained.

A specific description will be given. For example, in the case where the measurement current application device 9 is composed of a discharging circuit and a current limiting resistor 26 (FIG. 7) is used, the current limiting resistor 26 has sufficiently higher resistance than the internal resistance of the battery 2, and thus change of the battery internal resistance due to degradation has almost no effect on the current value. Therefore, even when the plurality of the battery groups 3 are connected in parallel, a value obtained by dividing a current value measured at the position of the discharging circuit (measurement current application device 9) by the number of the battery groups 3 connected in parallel can be used as a measurement current for each battery 2. For example, in the case where the current limiting resistor 26 has a resistance of 20 to 30Ω, since the battery internal resistance is about several milliohms to 10 mΩ, if the battery internal resistance is assumed as 10 mΩ, and when 150 batteries are connected in series, the total internal resistance is 1.5Ω. When three battery rows each including 150 batteries are connected in parallel, the total internal resistance is 0.5Ω, which is smaller than that of the current limiting resistor 26. Here, even when 10% of the internal resistances is doubled due to resistance degradation, the total internal resistance is 0.55Ω, and the total impedance is merely changed from 20.5Ω to 20.55Ω, which has a small effect on the measurement current. Therefore, the current sensor 8 may be shared.

In the present invention, a plurality of the battery groups 3 may be connected in series to form a series-connection assembly 3A, a plurality of the series-connection assemblies 3A may be connected in parallel, and, among the plurality of the series-connection assemblies 3A, parts a between the battery groups 3, of the individual series-connection assemblies 3A, corresponding to each other may be connected to each other, and among the plurality of the series-connection assemblies 3A, the battery groups 3 connected in parallel with each other may form the parallel-connection assembly 3B, and the current sensor 8 may be provided for each parallel-connection assembly 3B.

In the case where the power supply 1 is an emergency power supply in a data center or the like, the voltages of series-connection assemblies of the batteries in the entire power supply 1 are each a high voltage exceeding, for example, 300 V. Thus, when the measurement current application device 9, for example, a discharging circuit, is provided for the entire power supply 1, a switching element 27 that is a power element for applying a measurement current needs to be one having high voltage resistance. However, since each series-connection assembly of the batteries 2 is configured to be divided into a plurality of sections in the series direction as described above, an element having low voltage resistance can be used as the switching element 27, which is a power element for measurement current application in the discharging circuit. In the case where each series-connection assembly of the batteries 2 is configured to be divided into a plurality of sections in the series direction as described above, a current value for calculation of the internal resistance of each battery 2 is appropriately obtained by providing the current sensor 8 for each of the parallel-connection assemblies 3B of the divided series-connection assemblies 3A.

In the present invention, the measurement current application device 9 (for example, a discharging circuit) and the current sensor 8 may be incorporated within the controller 11. Accordingly, the configuration of the degradation determination device is further simplified and made more compact.

In this case, or in the case of any of the above configurations of the present invention, the current sensor 8 may be mounted on the same wiring board or circuit board 31 as the measurement current application device 9. Accordingly, the configuration of the degradation determination device is further simplified and made further compact.

In the present invention, the measurement current application device may be a discharging circuit. In the case of this configuration, a commercial power supply is not additionally used for measurement, and a current for measurement (for example, AC current) is generated by using the current flowing into the circuit that discharges the power supply 1 to be subjected to degradation determination. Thus, the measurement current application device 9 is simplified. The discharging circuit is, for example, a discharging circuit composed of a series circuit of the current limiting resistor 26 and the switching element 27 connected in parallel with the battery groups 3, and a current application control unit 11e that drives the switching element 27 to open/close such that the current flowing through this discharging circuit is a current having a pulse shape or a sine wave shape, may be included.

In the present invention, each voltage sensor 7 may include a conversion section 7bc configured to convert the measured measurement value to an effective value or an average value represented by a digital signal, and the sensor wireless communicator 10 may transmit the effective value or the average value resulting from the conversion by the conversion section 7bc, as a measurement value. The internal resistance of the battery 2 can be accurately calculated by using the effective value or the average value. In addition, when the measurement value of the voltage sensor 7 is transmitted as the effective value or the average value, the amount of data transmitted can be significantly smaller than that in the case of transmitting a signal of a voltage waveform.

In the present invention, the controller 11 has: an internal resistance calculation unit 13a configured to calculate the internal resistance of each battery 2 from the measurement value of each voltage sensor 7 and the measurement value of the current sensor 8 together with which the voltage sensor 7 is provided; and a determination unit 13b configured to determine degradation of each battery 2 on the basis of a calculation result of the internal resistance calculation unit 13a. Due to this configuration, degradation of the battery 2 can be accurately and simply determined.

In the present invention, the following configurations may be included. For example, each sensor wireless communicator 10 may have a function to receive a command and provide an instruction, corresponding to the command, to a sensor function unit 7a of the voltage sensor 7, and the controller 11 may have a function to transmit the command to each sensor wireless communicator 10.

The controller 11 may transmit a measurement start command, as the command, to each sensor wireless communicator 10. In this case, the sensor wireless communicator 10 starts measurement of the voltage sensor upon reception of the measurement start command. By transmitting the measurement start command from the controller 11 to each sensor wireless communicator 10 as described above, the timing of measurement of each voltage sensor 7 can be synchronized with each other.

In this case, the controller 11 simultaneously transmits the measurement start command to each voltage sensor 7 by means of serial transmission or parallel transmission, and each voltage sensor 7 simultaneously performs measurement after a measurement start delay time elapses. After the measurement, the controller 11 sequentially transmits a data transmission request command to each voltage sensor 7, and the voltage sensor 7 that has received the command transmits data. By repeating the above operations, data communication may be performed. In the present invention, after a certain time from the transmission of the data transmission request command, the controller 11 may make a request for retransmission to the voltage sensor 7 that fails to transmit data. As another example, the controller 11 may simultaneously transmit the measurement start command to each voltage sensor 7 by means of serial transmission or parallel transmission, and each voltage sensor 7 may perform measurement after elapse of a measurement start delay time determined for each voltage sensor, and sequentially transmit measured data in a set order.

As mentioned above, by each voltage sensor 7 performing measurement after elapse of the measurement start delay time determined for each voltage sensor, even if the measurement start command is simultaneously transmitted to each sensor wireless communicator 10, measurement of the multiple voltage sensors 7 can be sequentially performed without interfering with transmission, and transmission can be performed. Measurement of each voltage sensor 7 may be simultaneously performed, a transmission delay time may be set in advance for each voltage sensor 7, and measured data may be stored in a buffer or the like and sequentially transmitted. Accordingly, the same advantageous effects as described above are achieved. In the case where measurement is sequentially performed, a data storage portion for standby for transmission is unnecessary.

In the present invention, after a certain time from the transmission of the measurement start command, the controller 11 may make a request for retransmission to the voltage sensor 7 from which the controller 11 fails to receive data. Due to any temporary transmission problem or the like, the measurement start command cannot be received by the sensor wireless communicator 10 of some voltage sensors 7 in some cases. Even in such a case, as a result of making the request for retransmission, transmission can be performed, so that the voltage measurement values of all the batteries 2 of the power supply can be acquired. Whether the measurement start command has been received may be determined by determining whether the measurement value of the voltage has been received by the controller 11.

In the present invention, the controller 11 may individually transmit the measurement start command to the sensor wireless communicator 10 of each voltage sensor 7, rather than simultaneously transmitting the measurement start command as described above, and sequentially receive data therefrom. The measurement start command may be a data request command. In the case of this configuration, a delay section or part is unnecessary in the voltage sensor, and the configuration of the voltage sensor is simplified.

In the present invention, the controller 11 may have a determination unit 13*b* configured to output alerts at a plurality of levels in accordance with a magnitude of the calculated internal resistance. When the alerts at the plurality of levels are outputted in accordance with the magnitude of the internal resistance, the urgency of the need for battery replacement is recognized, and maintenance can be smoothly and quickly planned and prepared without wasted battery replacement.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DESCRIPTION OF EMBODIMENTS

Figure 1:
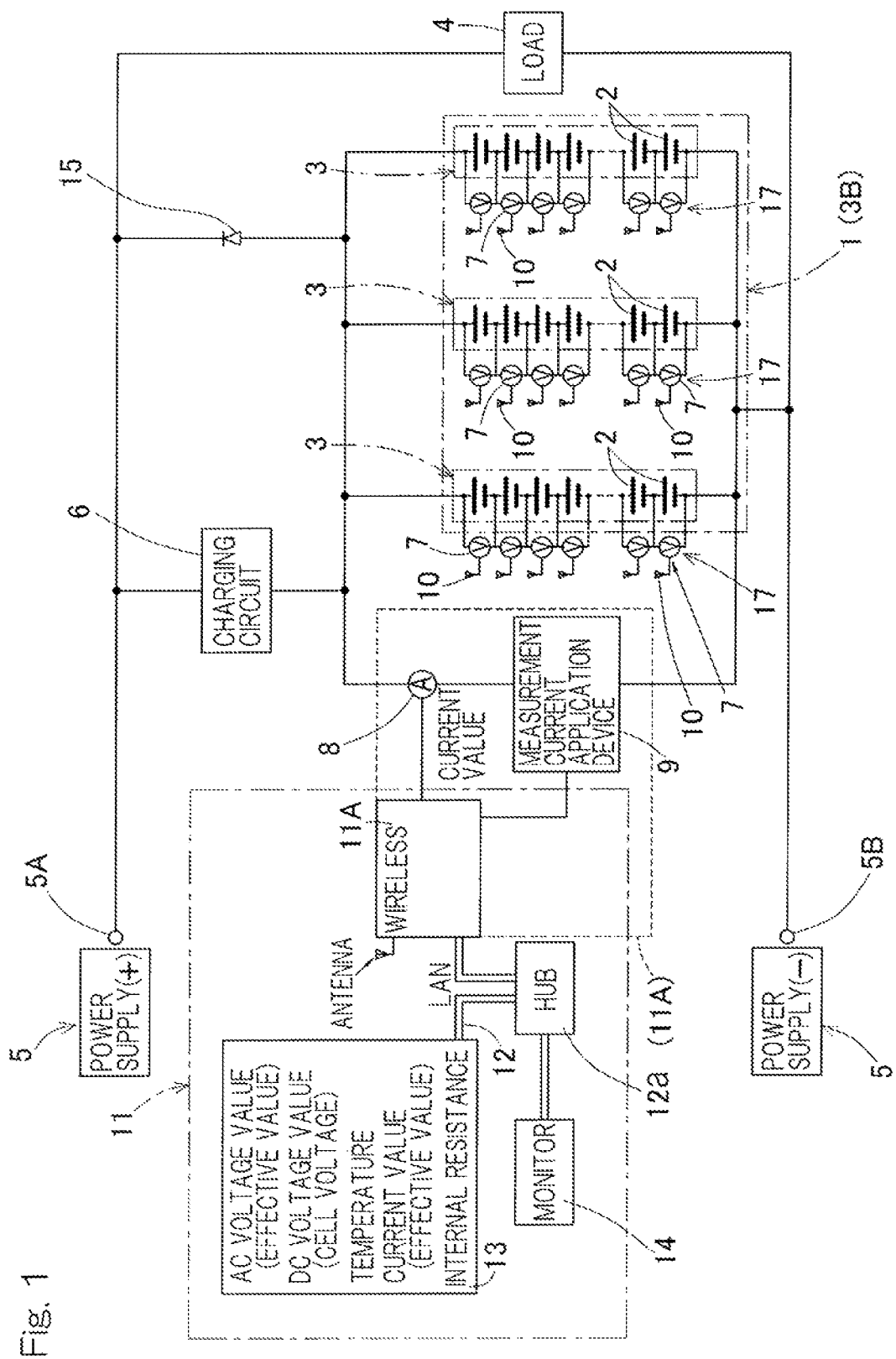
FIG. 1 is a circuit diagram of a secondary battery degradation determination device according to a first embodiment of the present invention.

A first embodiment of the secondary battery degradation determination device of the present invention will be described with reference to FIG. 1 to FIG. 3. In FIG. 1, a power supply 1 to be subjected to degradation determination is an emergency power supply in a data center, a mobile phone base station, or other various types of power supply devices for which stable supply of power is required. The power supply 1 has a plurality of battery groups 3 each including a plurality of batteries 2 that are secondary batteries and are connected in series. These battery groups 3 are connected in parallel to form a later-described parallel-connection assembly 3B and are connected to a load 4. Each battery 2 may be a single cell or may be a battery including a plurality of cells connected in series.

The emergency power supply 1 is connected via a charging circuit 6 and a diode 15 to a positive terminal 5A, and is connected directly to the negative terminal 5B, of positive and negative terminals 5A and 5B of a main power supply 5 that are respectively connected to positive and negative terminals of the load 4. The diode 15 is connected in parallel with the charging circuit 6 so as to be directed such that a current is caused to flow from the emergency power supply 1 to the load 4. The main power supply 5 includes, for example, a DC power supply that is connected to a commercial AC power supply via a rectifier circuit and a smoothing circuit (both of which are not shown) and performs conversion to DC power.

The positive potential of the emergency power supply 1 is lower than the positive potential of the main power supply 5 and current does not normally flow to the load 4. However, when the main power supply 5 is stopped or the function of the main power supply 5 is diminished, the potential at the main power supply 5 side is decreased, and thus power is supplied to the load 4 via the diode 15 by electric charge stored in the emergency power supply 1. A charge mode in which the charging circuit 6 is connected as described above is referred to as trickle charge mode.

The secondary battery degradation determination device determines degradation of each battery 2 in such a power supply 1. The secondary battery degradation determination device includes: a plurality of voltage sensors 7 individually connected to the respective batteries 2; one current sensor 8 connected to the power supply 1, which is the parallel-connection assembly 3B of the respective battery groups 3; a measurement current application device 9 that applies a measurement current including an AC component to the battery groups 3; a sensor wireless communicator 10 that is provided to each voltage sensor 7 and wirelessly transmits a measurement value of the voltage of the AC component measured; and a controller 11 that receives the measurement value transmitted by each sensor wireless communicator 10, calculates the internal resistance of each battery 2 by using the received measurement value, and determines degradation of the battery 2 on the basis of the internal resistance.

The measurement current application device 9 is composed of a charging device, for applying a measurement current including an AC component to the battery groups 3 of the power supply 1, or a discharging device, which achieves application of the measurement current by discharging the battery groups 3. The measurement current application device 9 is connected to positive and negative terminal ends of the battery groups 3 and applies a current including an AC component changing in a pulse shape or a sine wave shape, for example, a ripple current, to the power supply 1. The current sensor 8 is provided between the positive terminal end of the measurement current application device 9 and the positive terminal end of the battery groups 3.

Figure 2:
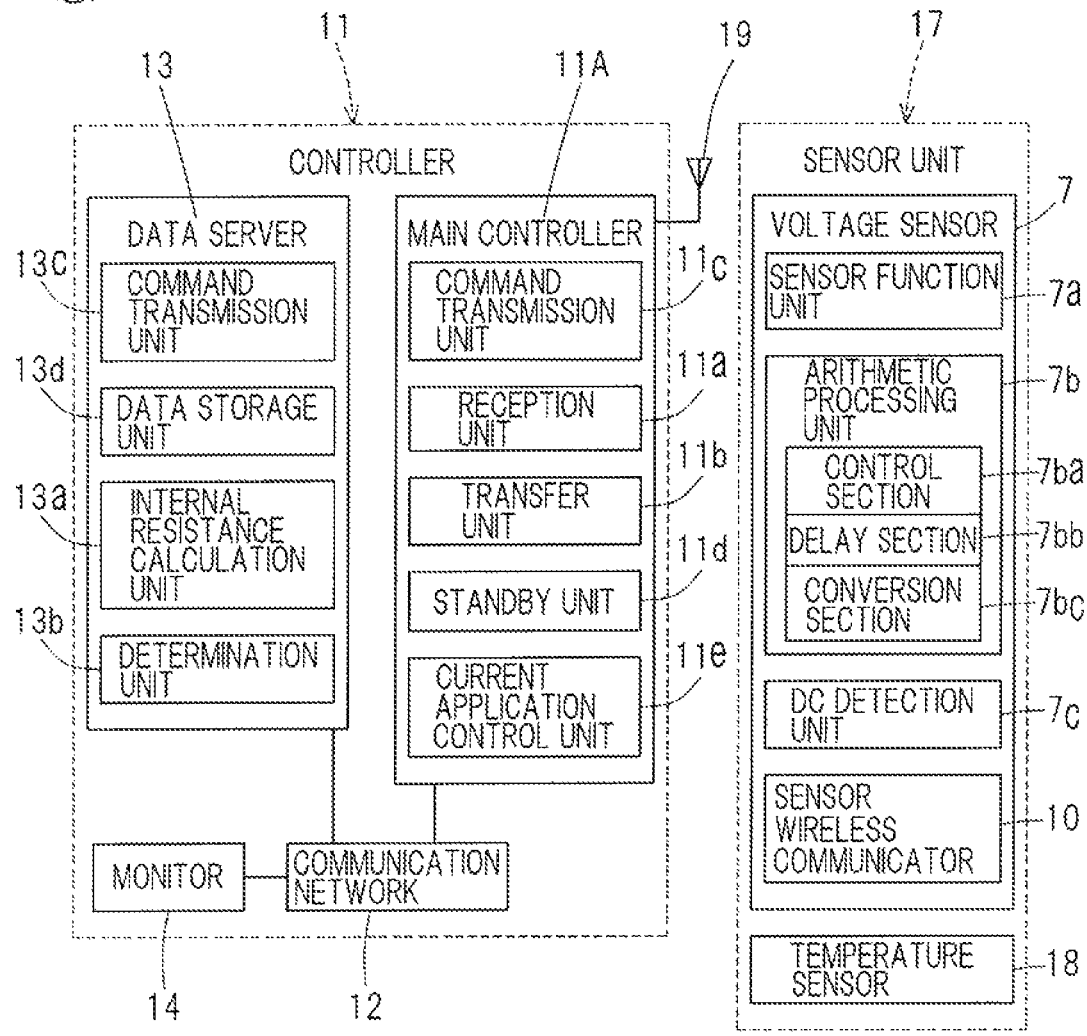
FIG. 2 is a block diagram showing a conceptual configuration of voltage sensors and a controller in the secondary battery degradation determination device.
Figure 2:
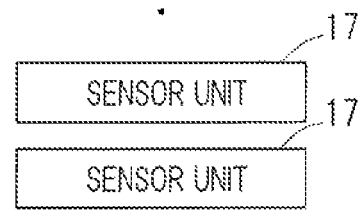

Each voltage sensor 7 performs detection of an AC component and a DC component of a voltage, and has a sensor function unit 7a and an arithmetic processing unit 7b as shown in FIG. 2. The sensor function unit 7a is composed of a voltage detection element or the like. The arithmetic processing unit 7b is provided with: a control section 7ba that executes a provided command; a delay section 7bb that delays start of measurement of the sensor function unit 7a with respect to a command by a predetermined time; and a conversion section 7bc that converts an analog detection value of an AC voltage detected by the sensor function unit 7a, to an effective value or an average value represented by a digital signal. The voltage sensor 7 also has a DC detection unit 7c that detects a DC voltage, and a detection value of a DC component detected by the DC detection unit 7c is also transmitted from the sensor wireless communicator 10. The sensor function unit 7a may also serve as the DC detection unit 7c. In addition, for each voltage sensor 7, a transmission order is preset with a transmission delay time by the delay section 7bb or by another configuration, and measurement values are sequentially transmitted in the set order after the transmission delay times such that the measurement values are transmitted from the respective voltage sensors 7 in a time multiplexing manner.

In this embodiment, a temperature sensor 18 that measures the ambient temperature of the battery 2 or the temperature of the battery 2 is provided, and at least the voltage sensor 7 and the temperature sensor 18 form a sensor unit 17. The detection temperature from the temperature sensor 18 is transmitted by the sensor wireless communicator 10 to the controller 11 together with the voltage measurement value represented by the effective value or the average value of the voltage sensor 7.

In this embodiment, the controller 11 includes a main controller 11A, and a data server 13 and a monitor 14 connected to the main controller 11A via a communication network 12. The communication network 12 is composed of a LAN in this embodiment and has a hub 12a (FIG. 1). The communication network 12 may be a wide area communication network. The data server 13 is able to communicate with a personal computer (not shown), etc., at a remote location via the communication network 12 or another communication network, and is able to perform data monitoring from any location.

The main controller 11A in FIG. 2 has: a reception unit 11a that receives the detection value of the voltage sensor 7 transmitted from each sensor wireless communicator 10; a transfer unit 11b that transfers the measurement value received by the reception unit 11a, to the communication network 12; a command transmission unit 11c that wirelessly transmits a command for start of transmission, etc., to the sensor wireless communicator 10 of each voltage sensor 7; a later-described standby unit 11d; and a current application control unit 11e. The current application control unit 11e controls the measurement current application device 9 (FIG. 1). In FIG. 2, wireless transmission and reception of the command transmission unit 11c and the reception unit 11a are performed via an antenna 19.

As shown in FIG. 1, the current sensor 8 is connected to the main controller 11A via a wire, and the current measurement value thereof is transferred together with the voltage measurement value from the transfer unit 11b in FIG. 2. The command transmission unit 11c of the main controller 11A may generate a command by itself. However, in this embodiment, in response to a measurement start command transmitted from the data server 13, the command transmission unit 11c transfers the measurement start command to the sensor wireless communicator 10 of each voltage sensor 7. The main controller 11A or the current sensor 8 is provided with a conversion unit (not shown) that converts the measurement value of the current sensor 8 to an effective value or an average value.

As described above, the controller 11 has a function to transmit the command to each sensor wireless communicator 10, and each sensor wireless communicator 10 has a function to provide an instruction corresponding to this command to the arithmetic processing unit 7*b*, which is provided in the voltage sensor 7, upon reception of this command.

The data server 13 has an internal resistance calculation unit 13*a* and a determination unit 13*b*. The internal resistance calculation unit 13*a* calculates the internal resistance of the battery 2 according to a predetermined calculation formula by using the AC voltage value (the effective value or the average value) transmitted and received from the main controller 11A, the DC voltage value (cell voltage), the detection temperature, and the current value (the effective value or the average value). The detection temperature is used for temperature correction.

A threshold is set in the determination unit 13*b*, and the determination unit 13*b* determines that degradation has occurred, when the calculated internal resistance is equal to or greater than the threshold. The threshold may be set at a plurality of levels, for example, two or three levels. In this case, degradation determination is performed at the plurality of levels, and warnings or alerts corresponding to the plurality of levels are outputted as described later. The determination unit 13*b* has a function to display the determination result on the monitor 14 via the communication network 12 or via a dedicated wire. In addition, the data server 13 has: a command transmission unit 13*c* that transmits the measurement start command to the main controller 11A; and a data storage unit 13*d* that stores therein data such as the voltage measurement value transmitted from the main controller 11A.

In the above configuration, the main controller 11A and the measurement current application device 9 may form an integral controller housed in the same case. In addition, although the controller 11 includes the main controller 11A and the data server 13 in this embodiment, the main controller 11A and the data server 13 may form a single controller 11 housed in the same case, or may be configured in one information processing device including one board or the like such that the main controller 11A and the data server 13 are not distinguished from each other on the board.

Operation of the degradation determination device having the above configuration will be described. FIG. 3 is a flowchart of an example of the operation. The data server 13 transmits the measurement start command from the command transmission unit 13*c* (step S1). The main controller 11A receives the measurement start command from the data server 13 (step S2) and transmits the measurement start command to the sensor wireless communicator 10 of each voltage sensor 7 and the current sensor 8 (step S3). In parallel to processes after this transmission, the standby unit 11*d* performs determination of end of a standby time (step S20) and counts the standby time (step S22). When the set standby time ends, the measurement current application device 9 applies a current (step S21). For the application of the current, discharging is started when the measurement current application device 9 is a discharging device, and charging is started when the measurement current application device 9 is a charging device.

All the voltage sensors 7 receive the measurement start command transmitted in step S3 (step S4), and each voltage sensor 7 waits for end of their own measurement delay time (step S5) and measures the DC voltage (inter-terminal voltage) of the battery 2 (step S6). Thereafter, the voltage sensor 7 waits for end of a standby time (step S7) and measures the AC voltage of the battery 2 (step S8). Regarding measurement of the AC voltage, the voltage sensor 7 converts a direct measurement value to an effective voltage or an average voltage and outputs the resultant conversion value as a measurement value.

The sensor wireless communicator 10 waits for its own transmission delay time and wirelessly transmits the measured DC voltage and the measured AC voltage (step S9), and the main controller 11A of the controller 11 wirelessly receives the measured DC voltage and the measured AC voltage (step S10). The main controller 11A transmits the received DC voltage and the received AC voltage together with the detection values of the current sensor 8 and the temperature sensor 18 (FIG. 2) to the data server 13 via the communication network 12 such as a LAN (step S11). The data server 13 receives sequentially transmitted data of the sensors such as the respective voltage sensors 7 and stores the data in the data storage unit 13*d* (step S12). The steps from the wireless transmission in step S9 until the data storage by the data server 13 are performed until reception and storage of the data of all the voltage sensors 7 have been completed (No in step S12).

After the reception and the storage have been completed (YES in step S12), the current application of the measurement current application device 9 is turned off on the basis of transmission of a completion signal from the data server 13 to the main controller 11A and output of a current application control signal of the main controller 11A (step S16), and, in the data server 13, the internal resistance calculation unit 13*a* calculates the internal resistance of each battery 2 (step S13).

The determination unit 13*b* of the data server 13 compares the calculated internal resistance to a first threshold predetermined as appropriate (step S14). When the internal resistance is less than the first threshold, the determination unit 13*b* determines that the battery 2 is in a normal state (step S15). When the internal resistance is not less than the first threshold, the determination unit 13*b* further compares the internal resistance to a second threshold (step S17). When the internal resistance is less than the second threshold, the determination unit 13*b* outputs a warning for drawing attention (step S18). When the internal resistance is not less than the second threshold, the determination unit 13*b* outputs an alert that is stronger than the warning (step S19). The warning and the alert are displayed on the monitor 14 (FIG. 1). When the battery 2 is in the normal state, the battery 2 being in the normal state may be displayed on the monitor 14, or does not have to be particularly displayed thereon. The alert and the warning may be displayed on the monitor 14, for example, by marks such as predetermined icons or by lighting predetermined portions, etc. In this manner, degradation determination is performed for all the batteries 2 of the emergency power supply 1. FIG. 3 is an example of degradation determination (and display of an alert, etc.) at two levels.

According to the secondary battery degradation determination device, as described above, the voltage sensor 7 is provided for each battery 2, and data is passed and received as digital signals by means of wireless communication. Thus, even in the case with the emergency power supply 1 including dozens to hundreds of batteries 2, there is no need to care about reference potential (ground level) for each battery 2 from the electrical standpoint. Therefore, differential operation and an isolation transformer are not necessary. In addition, since the measurement value of each of such multiple voltage sensors 7 is wirelessly transmitted, complicated wiring is not necessary. Accordingly, the configuration can be simple and inexpensive.

Degradation of the entire power supply 1 to be subjected to degradation determination is not determined, but degradation of each battery 2 is determined. In addition, for the determination, the measurement current including the AC component is applied, the internal resistance of each battery 2 is calculated by using the measurement value transmitted by each sensor wireless communicator 10, and degradation of the battery 2 is determined on the basis of the internal resistance. Thus, degradation determination can be accurately performed. The internal resistance of the battery 2 is closely related to the capacity of the battery 2, that is, the degree of degradation of the battery 2, and thus degradation of the battery 2 can be accurately determined when the internal resistance is known.

The measurement value measured by each voltage sensor 7 is converted to an effective value or an average value represented by a digital signal, and is transmitted. Thus, the amount of data transmitted can be significantly smaller than that in the case of transmitting a signal of a voltage waveform. The internal resistance of the battery 2 can be accurately calculated by using the effective value or the average value. Merely with measurement of a voltage, the calculation of the internal resistance of the battery 2 is possible, for example, by assuming a current as a constant value. However, the internal resistance can be more accurately calculated when a current actually flowing through the battery 2 is measured and both the voltage and the current are acquired.

In FIG. 1, the one current sensor 8 is provided for the power supply 1, which is the one parallel-connection assembly 3B. Thus, as compared to the case where a current sensor is provided for each battery group 3, the configuration is simple, and thus the number of components is small and the cost is reduced. The currents flowing through the respective batteries 2 aligned in series in each battery group 3 are equal to each other, and, in the case where the number of the batteries 2 connected and the rated voltage of each battery 2 in each battery group 3 are the same, the currents flowing through the respective battery groups 3 are considered to be substantially equal to each other, and the difference therebetween can be considered not to be increased to such a degree that the difference practically influences calculation of the internal resistance for determination of the life of each battery 2. Thus, by providing the one current sensor 8, practical influence on the accuracy of calculation of the internal resistance of the battery 2 is minimized, and also configuration simplification and cost reduction can be achieved.

The controller 11 transmits the measurement start command to the sensor wireless communicator 10 of each voltage sensor 7, and measurement of the voltage sensor 2 is started by the command. Thus, the timing of start of measurement of the multiple voltage sensors 2 can be synchronized with each other. In this case, the controller 11 simultaneously transmits the measurement start command to each voltage sensor 7 by means of serial transmission or parallel transmission, and each voltage sensor 7 simultaneously performs measurement after the measurement start delay time elapses. After the measurement, the controller 11 sequentially transmits a data transmission request command to each voltage sensor 7, and the voltage sensor 7 that has received the command transmits data. By repeating the above operations, data communication may be performed. In this embodiment, after a certain time from the transmission of the data transmission request command, the controller 11 may make a request for retransmission to the voltage sensor 7 that fails to transmit data.

As another example, in the case where, after elapse of a measurement start delay time predetermined for each voltage sensor 7, the voltage sensor 7 performs measurement, even when the measurement start command is simultaneously transmitted to each sensor wireless communicator 10, measurement of the multiple voltage sensors 7 can be sequentially performed without interfering with wireless transmission and reception, and transmission can be performed. For example, a transmission start command is a global command, and the voltage sensors 7 simultaneously acquire the transmission start command.

After a certain time from the transmission of the measurement start command, the controller 11 makes a request for retransmission to the voltage sensor 7 from which the controller 11 fails to receive data. Due to any temporary transmission problem or the like, the measurement start command cannot be received by the sensor wireless communicator 10 of some voltage sensors 7 in some cases. Even in such a case, as a result of making the request for retransmission, a voltage can be measured and transmitted, so that the voltage measurement values of all the batteries 2 of the power supply can be acquired. Whether the measurement start command has been received may be determined by determining whether the measurement value of the voltage has been received by the controller 11.

The controller 11 may individually transmit a data request command to the sensor wireless communicator 10 of each voltage sensor 7, rather than simultaneously transmitting the measurement start command as described above, and may sequentially receive data therefrom. In the case of this configuration, the delay section 7bb is unnecessary in the voltage sensor 7, and the configuration of the voltage sensor 7 is simplified. Since the controller 11 outputs alerts at a plurality of levels in accordance with the magnitude of the calculated internal resistance, the urgency of the need for battery replacement is recognized, and maintenance can be smoothly and quickly planned and prepared without wasted battery replacement.

The controller 11 or the internal components thereof are specifically configured with a hardware circuit or a software mathematical function on a processor (not shown) which enables calculation and output of a result thereof, with use of a LUT (Look Up Table) implemented by software or hardware, or a prescribed transform function contained in a library of software or hardware equivalent thereto, etc., and, as necessary, a comparison function or a four arithmetic operation function in the library or hardware equivalent thereto, etc.

Figure 4:
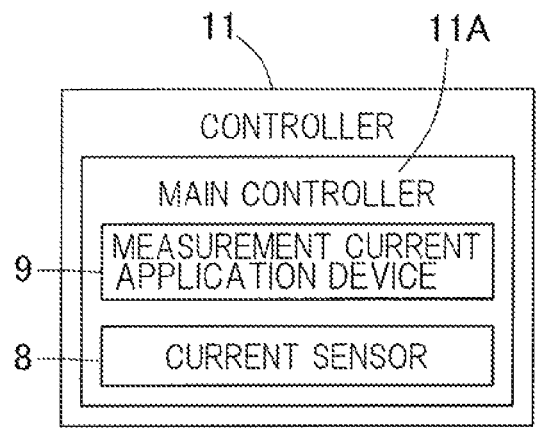
FIG. 4 is a block diagram showing the relationship among the controller, a current sensor, etc., in a modification of the secondary battery degradation determination device.

FIG. 4 shows a modification of arrangement of the current sensor 8, etc. In the embodiment shown in FIG. 1, the current sensor 8 and the measurement current application device 9 are provided outside the controller 11. However, as shown in FIG. 4, the current sensor 8 and the measurement current application device 9 may be provided within the controller 11, for example, within the main controller 11A (shown by a rectangular broken line in FIG. 1). The measurement current application device 9 may be a discharging circuit described later with reference to FIG. 7. In addition, although not shown, only one of the current sensor 8 and the measurement current application device 9 may be provided within the controller 11, for example, within the main controller 11A. Accordingly, the configuration of the degradation determination device is further simplified and made more compact.

Figure 5:
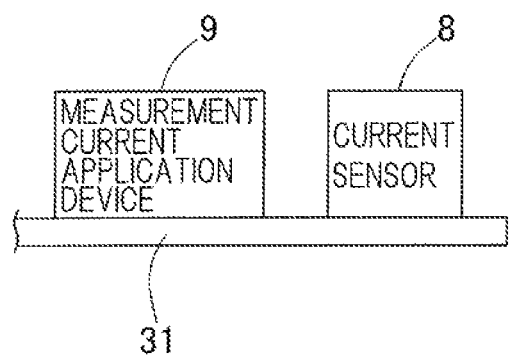
FIG. 5 is a block diagram showing the relationship among the controller, a wiring board, the current sensor, etc., in the modification of the secondary battery degradation determination device.

In the case where the current sensor 8 and the measurement current application device 9 are provided within the controller 11 as described above, the measurement current application device 9 and the current sensor 8 may be mounted on the same wiring board 31 as shown in FIG. 5.

Furthermore, although not shown, only one of the current sensor 8 and the measurement current application device 9 may be mounted on the same wiring board 31 as the other components forming the controller 11. Accordingly, the configuration of the degradation determination device is further simplified, so that the configuration is further made compact and the cost is further reduced.

Figure 3:
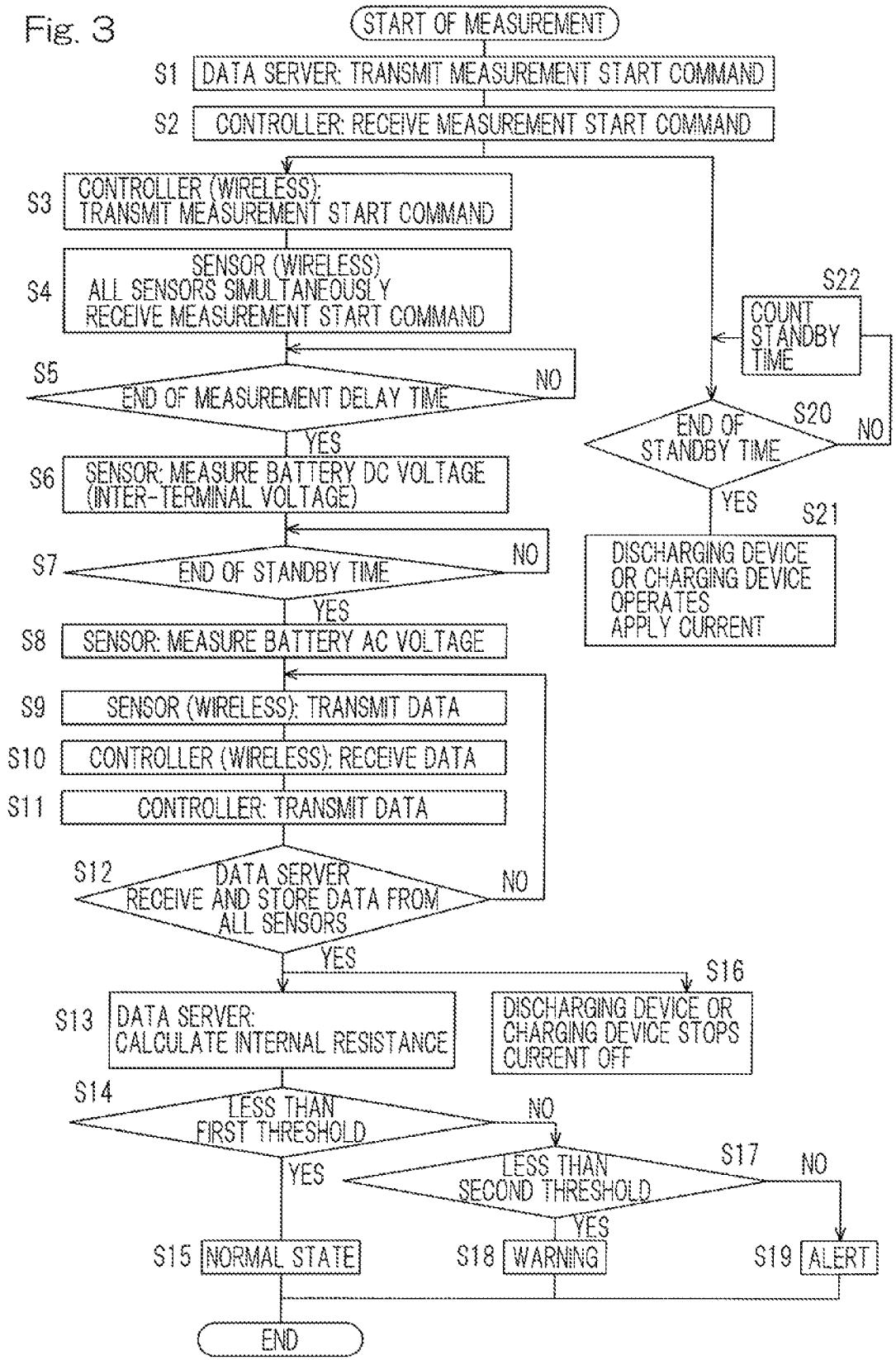
FIG. 3 is a flowchart showing an example of operation of the secondary battery degradation determination device.
Figure 6:
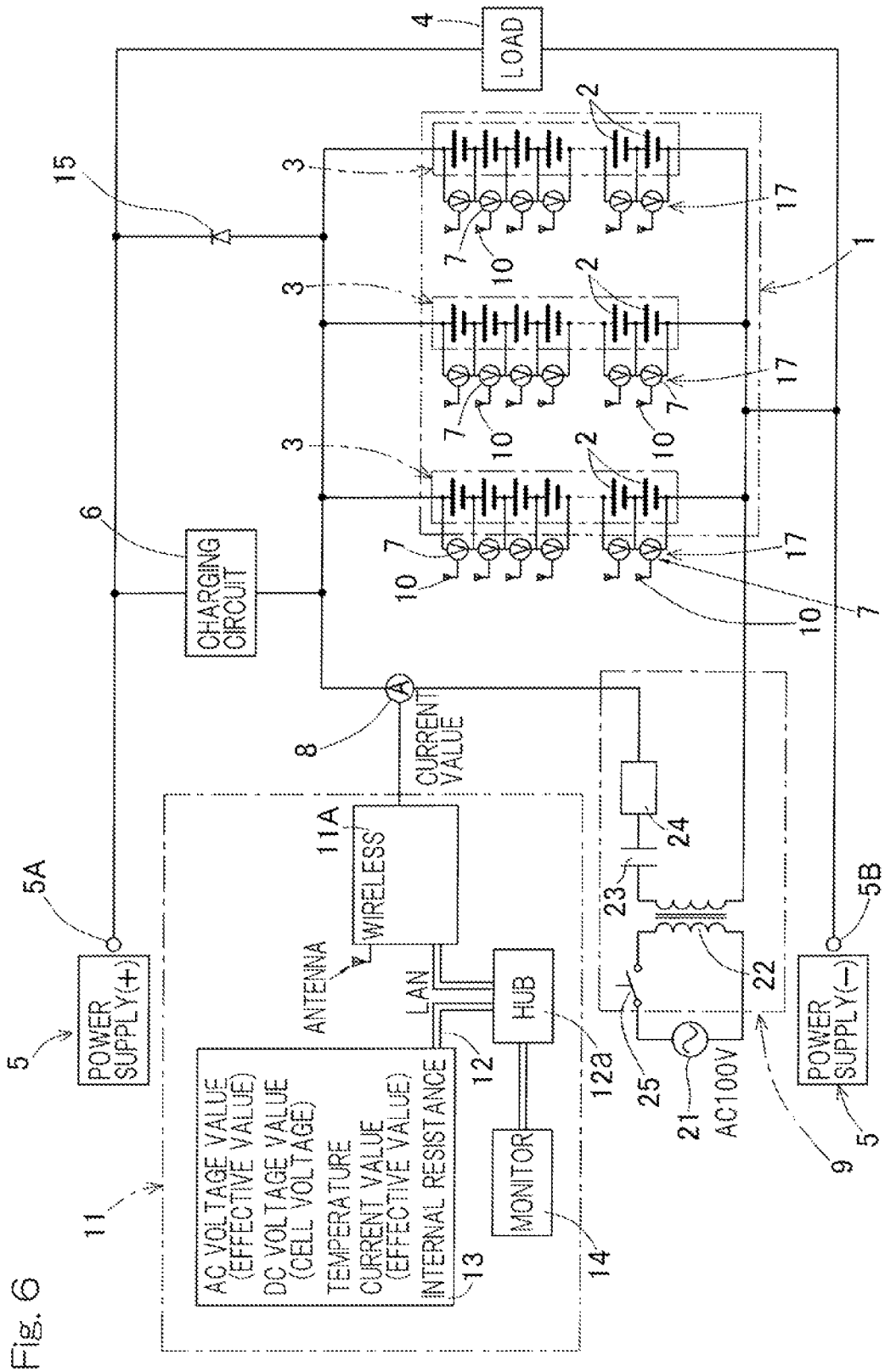
FIG. 6 is a circuit diagram of a secondary battery degradation determination device according to another embodiment of the present invention.

FIG. 6 shows another embodiment in which the measurement current application device 9 in the above embodiment shown in FIG. 1 to FIG. 3 is embodied. In this embodiment, the measurement current application device 9 generates a measurement current including an AC component, from a commercial AC power supply 21, and applies the measurement current to each battery group 3. More specifically, the measurement current application device 9 includes: a transformer 22 that performs voltage conversion such that the voltage of the commercial AC power supply 21 is converted suitably for the voltage of the emergency power supply 1; a capacitor 23 that separates only the AC component from the current resultant from the conversion by the transformer 22 and applies the AC component to each battery group 3; and a current limiting unit 24 that limits the current to be applied to each battery group 3. A primary circuit of the transformer 22 is provided with an opening/closing switch 25 that opens/closes (disconnects from/connects to) the commercial power supply 21. Opening/closing of the opening/closing switch 25 is controlled by the current application control unit 11e (see FIG. 2) in the main controller 11A of the controller 11. In FIG. 6, the current limiting unit 24 may be a current limiting resistor.

In the case of this configuration, since the measurement current including the AC component is generated from the commercial AC power supply 21, the measurement current including the AC component can be applied to each battery group 3 by a simple configuration. Since the transformer 22 and the capacitor 23 are provided, even when the voltages of the commercial power supply 21 and each battery group 3 are different from each other, the voltage in order to flow the measurement current can be made equal to the voltage of each battery group 3, and only the AC component can be applied to each battery group 3. In addition, since the current limiting unit 24 such as a resistor is provided, the current to be applied to each battery group 3 can be limited, so that each battery group 3 can be protected from an overcurrent. The other configurations and advantageous effects in this embodiment are the same as those in the first embodiment described with reference to FIG. 1 to FIG. 3.

Figure 7:
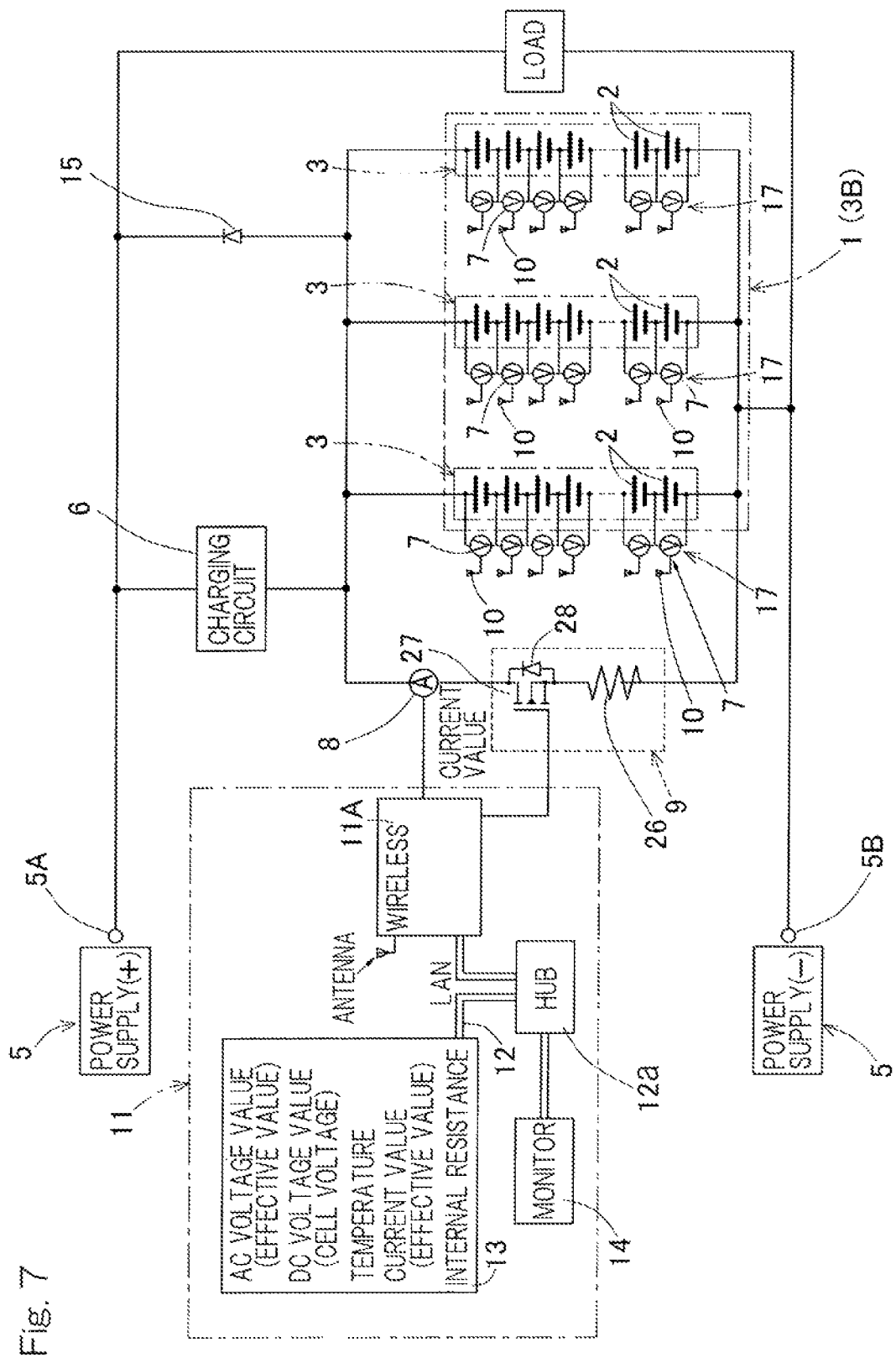
FIG. 7 is a circuit diagram of a secondary battery degradation determination device according to a modification in which the embodiment is partially modified.

FIG. 7 shows a modification in which the other embodiment is partially modified. In this modification, the measurement current application device 9 in the first embodiment shown in FIG. 1 to FIG. 3 is configured by a discharging circuit composed of a series circuit of a current limiting resistor 26 and a switching element 27, and the discharging circuit is connected in parallel with the battery groups 3. A bypass diode 28 is provided to the switching element 27. The switching element 27 is driven to open/close by the current application control unit 11e in the main controller 11A of the controller 11 such that the current flowing through the discharging circuit is a current having a pulse shape or a sine wave shape. In this case, unlike the example in FIG. 6, the current application control unit 11e is configured to provide an instruction to drive the switching element 27 such that the current has a pulse shape or a sine wave shape as described above.

In the case of this configuration, a commercial power supply is not used for measurement, and a measurement current is generated by using the current applied to the circuit that charges the emergency power supply 1 to be subjected to degradation determination. Thus, the measurement current application device 9 is simplified as compared to the embodiment in FIG. 6 in which the commercial power supply is used. The other configurations and advantageous effects are the same as those in the first embodiment shown in FIG. 1 to FIG. 3.

Figure 8:
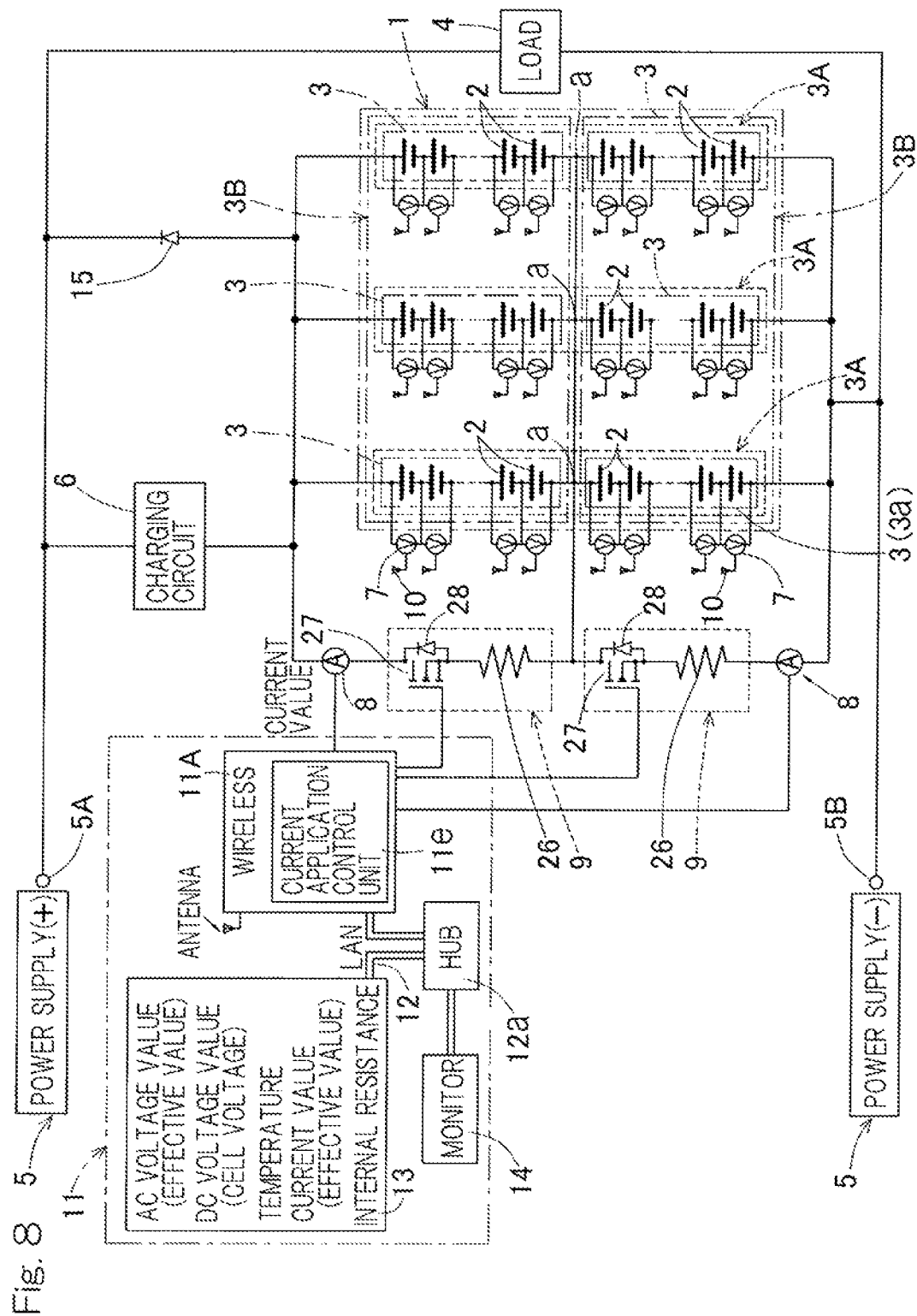
FIG. 8 is a circuit diagram of a secondary battery degradation determination device according to still another embodiment of the present invention.
Figure 9:
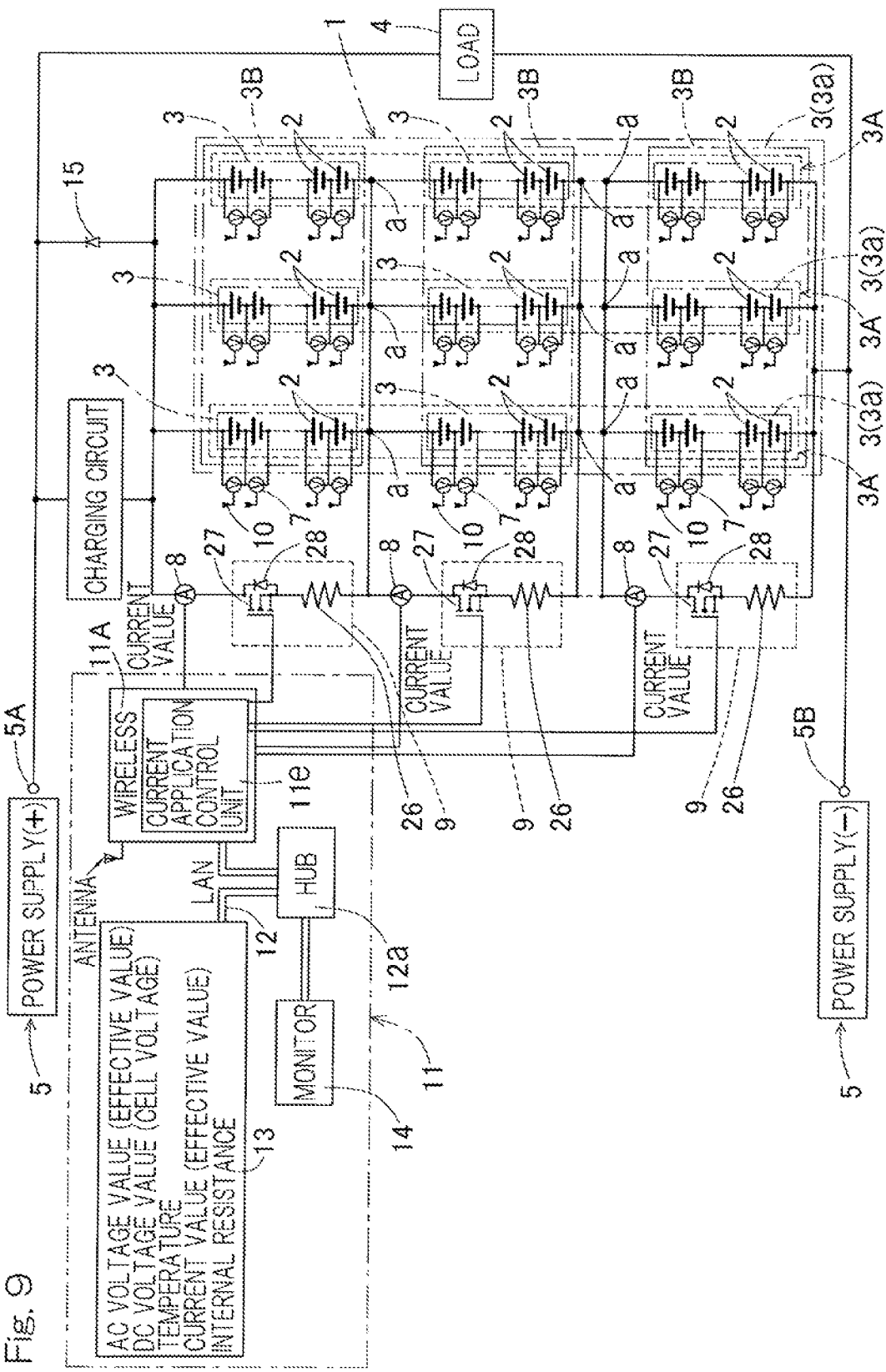
FIG. 9 is a circuit diagram of a secondary battery degradation determination device according to still another embodiment of the present invention.
Figure 10:
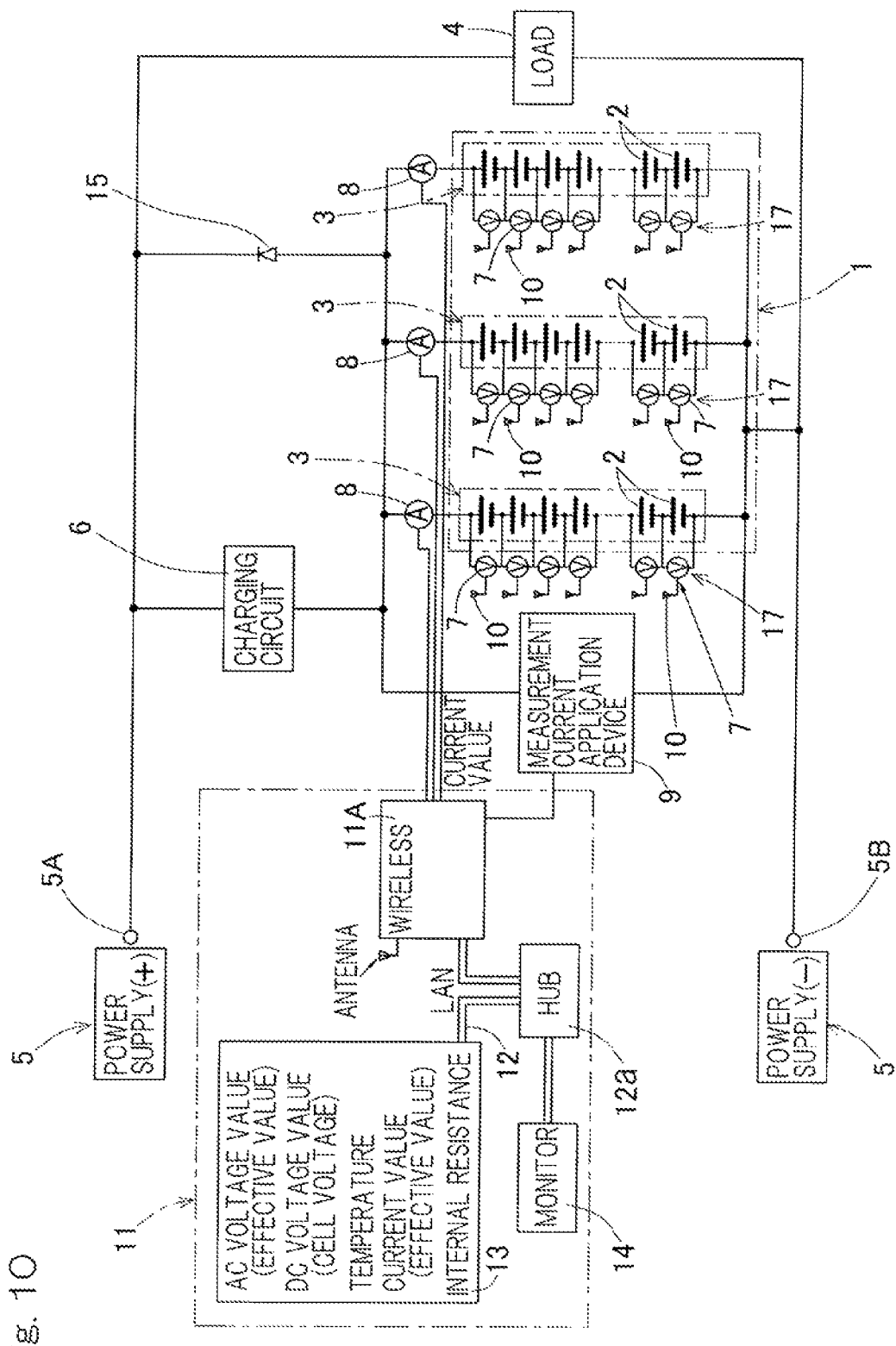
FIG. 10 is a circuit diagram of a secondary battery degradation determination device according to a proposal example.

FIG. 8 and FIG. 9 each show still another embodiment. In these embodiments, the configuration other than the matters described in particular are the same as in the first embodiment shown in FIG. 1 to FIG. 3, and the respective advantageous effects described in the first embodiment are achieved.

In FIG. 8, in the power supply 1, a plurality of series-connection assemblies 3A (three in the example in FIG. 8), each including a plurality of battery groups 3 (two in the example in FIG. 8) connected in series, are connected in parallel. Among the plurality of series-connection assemblies 3A, parts a between the respective battery groups 3 forming the series-connection assemblies 3A, corresponding to each other, are connected to each other. Among the plurality of series-connection assemblies 3A, the battery groups 3 connected in parallel with each other form the parallel-connection assembly 3B. The measurement current application device (discharging circuit) 9 and the current sensor 8 are provided for each parallel-connection assembly 3B.

In other words, when each series-connection assembly 3A in the power supply 1 is regarded or assumed as one battery group 3, this one battery group 3 is divided into a plurality of (two) battery group division bodies 3a aligned in the series direction, and the battery group division bodies 3a are connected in parallel with other battery group division bodies 3a forming other battery groups 3. The measurement current application device (discharging circuit) 9 is provided in parallel with each connection assembly including the battery group division bodies 3a connected in parallel (that is, each parallel-connection assembly 3B). The number of battery group division bodies 3a obtained by division is not limited, but a plurality of the batteries 2 are connected in series in each battery group division body 3a.

In the case where the power supply 1 is an emergency power supply in a data center or the like, the voltages of the series-connection assemblies of the batteries 2 in the entire power supply 1 are each a high voltage exceeding, for example, 300 V. Thus, when the measurement current application device (discharging circuit) 9 is provided for the entire power supply 1, the switching element 27 that is a power element for applying a measurement current needs to be one having high voltage resistance. However, since each series-connection assembly of the batteries 2 is configured to be divided into two sections in the series direction as in this embodiment, an element having low voltage resistance can be used as the switching element 27, which is a power element for measurement current application in the measurement current application device (discharging circuit) 9.

The embodiment in FIG. 9 is an example in which three or more battery groups 3 are connected in series to form the series-connection assemblies 3A in the embodiment shown in FIG. 8. In other words, when each series-connection assembly of the batteries 2 of the power supply 1 is regarded or assumed as one battery group 3, this one battery group 3 includes three or more battery group division bodies 3a. Among the plurality of series-connection assemblies 3A, parts a between the respective battery groups 3 forming the series-connection assemblies 3A, corresponding to each other, are connected to each other. For the respective parallel-connection assemblies 3B configured in this manner, three or more measurement current application devices (discharging circuits) 9 and three or more current sensors 8 are provided in parallel. In this embodiment as well, an element having low voltage resistance can be used as the switching element 27, which is a power element for measurement current application.

Although the present invention has been fully described in connection with the preferred embodiments thereof with reference to the accompanying drawings, numerous additions, modifications and omissions can be made without departing from the gist of the present invention. Accordingly, such additions, modifications and omissions are to be construed as included in the scope of the present invention.

REFERENCE NUMERALS

1 . . . power supply
2 . . . battery
3 . . . battery group
3A . . . series-connection assembly
3B . . . parallel-connection assembly
4 . . . load
5 . . . main power supply
5A, 5B . . . terminal
6 . . . charging circuit
7a . . . sensor function unit
7b . . . arithmetic processing unit
7ba . . . control section
7bb . . . delay section
7bc . . . conversion section
7c . . . DC detection unit
8 . . . current sensor
9 . . . measurement current application device
10 . . . sensor wireless communicator
11 . . . controller
11A . . . main controller
11a . . . reception unit
11b . . . transfer unit
11c . . . command transmission unit
11d . . . standby unit
11e . . . current application control unit
12 . . . communication network
13 . . . data server
13a . . . internal resistance calculation unit
13b . . . determination unit
14 . . . monitor
15 . . . diode
17 . . . sensor unit
18 . . . temperature sensor
19 . . . antenna
25 . . . opening/closing switch
26 . . . current limiting resistor
27 . . . switching element
a . . . part

What is claimed is:

1. A secondary battery degradation determination device that determines degradation of each battery in a power supply in which a plurality of battery groups each including a plurality of batteries that are secondary batteries and are connected in series are connected in parallel, the secondary battery degradation determination device comprising:
a plurality of voltage sensors individually connected to the respective batteries;
a current sensor provided for a parallel-connection assembly including a plurality of the battery groups connected in parallel, the current sensor being configured to detect a current flowing through an entirety of the parallel-connection assembly;
a measurement current application device configured to apply a measurement current including an AC component to each battery group;
a sensor wireless communicator provided to each voltage sensor and configured to wirelessly transmit a measurement value of a voltage of the AC component measured; and
a controller configured to receive the measurement value transmitted by each sensor wireless communicator, calculate an internal resistance of each battery by using the received measurement value and a measurement value of the current sensor, and determine degradation of the battery on the basis of the internal resistance.

2. The secondary battery degradation determination device as claimed in claim 1, wherein
a plurality of the battery groups are connected in series to form a series-connection assembly,
a plurality of the series-connection assemblies are connected in parallel, and, among the plurality of the series-connection assemblies, parts between the battery groups, of the individual series-connection assemblies, corresponding to each other are connected to each other, and
among the plurality of the series-connection assemblies, the battery groups connected in parallel with each other form the parallel-connection assembly, and the current sensor is provided for each parallel-connection assembly.

3. The secondary battery degradation determination device as claimed in claim 1, wherein the measurement current application device and the current sensor are incorporated within the controller.

4. The secondary battery degradation determination device as claimed in claim 1, wherein the current sensor is mounted on the same wiring board as the measurement current application device.

5. The secondary battery degradation determination device as claimed in claim 1, wherein the measurement current application device is a discharging circuit.

6. The secondary battery degradation determination device as claimed in claim 1, wherein each voltage sensor includes a conversion section configured to convert the measured measurement value to an effective value or an average value represented by a digital signal, and the sensor wireless communicator transmits the effective value or the average value resulting from the conversion by the conversion section, as a measurement value.

7. The secondary battery degradation determination device as claimed in claim 1, wherein the controller has: an internal resistance calculation unit configured to calculate the internal resistance of each battery from the measurement value of each voltage sensor and the measurement value of the current sensor together with which the voltage sensor is provided; and a determination unit configured to determine degradation of each battery on the basis of a calculation result of the internal resistance calculation unit.

* * * * *